United States Patent
Kukanskis et al.

(10) Patent No.: US 7,022,464 B2
(45) Date of Patent: Apr. 4, 2006

(54) INTEGRAL PLATED RESISTOR AND METHOD FOR THE MANUFACTURE OF PRINTED CIRCUIT BOARDS COMPRISING THE SAME

(76) Inventors: Peter Kukanskis, 245 Quassapaug Rd., Woodbury, CT (US) 06798; Steven Castaldi, 330 Notinghill Gate, Torrington, CT (US) 06790

( * ) Notice: Subject to any disclaimer, the term of this patent is extended or adjusted under 35 U.S.C. 154(b) by 0 days.

(21) Appl. No.: 10/925,589

(22) Filed: Aug. 25, 2004

(65) Prior Publication Data

US 2006/0046202 A1    Mar. 2, 2006

(51) Int. Cl.
*G03F 7/00* (2006.01)
*C22C 18/32* (2006.01)

(52) U.S. Cl. .................... 430/315; 430/311; 430/313; 427/99.5; 427/126.6

(58) Field of Classification Search ................ 430/311, 430/313, 315; 427/99.5, 126.6
See application file for complete search history.

(56) References Cited

U.S. PATENT DOCUMENTS

| | | | |
|---|---|---|---|
| 6,281,090 B1 | 8/2001 | Kukanskis et al. | 438/382 |
| 6,440,318 B1 | 8/2002 | Lee et al. | 216/13 |
| 6,610,417 B1 * | 8/2003 | Andresakis et al. | 428/607 |
| 6,680,441 B1 | 1/2004 | Kondo et al. | 174/260 |
| 6,767,445 B1 | 7/2004 | Kukanskis et al. | 205/125 |
| 2003/0112110 A1 | 6/2003 | Pavier | 336/96 |
| 2003/0161959 A1 | 8/2003 | Kodas et al. | 427/376.2 |
| 2003/0231099 A1 | 12/2003 | Schemenaur et al. | 338/308 |

FOREIGN PATENT DOCUMENTS

WO   WO 89/02212   9/1989

\* cited by examiner

*Primary Examiner*—Nicole Barreca
(74) *Attorney, Agent, or Firm*—Carmody & Torrance LLP

(57) ABSTRACT

An integral plated resistor having an improved range of resistance is produced by uniformly dispersing an effective amount of various particles in an electroless nickel phosphorus plating composition so that the particles are codeposited with the electroless nickel phosphorus plating composition. Preferred particles include, polytetrafluoroethylene, silicon carbide, tungsten carbide, and other particles that fully sinter at a temperature of less than about 170° C. The improved nickel phosphorus plated resistors of the invention demonstrate increased stability during manufacturing press cycles and a greater range of resistance values than have previously been achieved.

9 Claims, No Drawings

INTEGRAL PLATED RESISTOR AND METHOD FOR THE MANUFACTURE OF PRINTED CIRCUIT BOARDS COMPRISING THE SAME

FIELD OF INVENTION

The present invention relates to a process for the manufacture of double-sided or multi-layer printed circuit boards with improved integral plated resistors. The improved resistors of the invention have an expanded resistance range and are more stable under the press conditions necessary for forming multi-layer printed circuit boards.

BACKGROUND OF THE INVENTION

In the manufacture of printed circuits, it is commonplace to provide planar boards having circuitry on each side thereof. It is also commonplace to produce boards comprised of integral planar laminates of insulating substrate and conductive metal, wherein one or more parallel innerlayers or planes of the conductive metal, separated by insulating substrate, are present within the structure with the exposed outer surfaces, along with the innerlayers, of the laminate containing printed circuit patterns.

The typical manufacturing sequence for producing printed circuit boards begins with a copper-clad laminate. The copper-clad laminate typically comprises a glass reinforced epoxy insulating substrate with copper foil adhered to both planar surfaces of the substrate. Other types of insulating substrates, including paper phenolic and polyimides, may also be used. In the case of multi-layer boards, the starting material is a copper clad laminate, which comprises innerlayers of circuitry.

Simple printed circuit boards and innerlayers of multi-layered circuit boards are generally produced through a technique called print and etch. In this manner, a photopolymer is laminated or coated on the copper surface of a copper clad laminate. The photopolymer is then selectively imaged using negative or positive photomask technology and developed to produce the desired circuit pattern on the surfaces of the copper clad laminate. The exposed copper is then etched away and the photopolymer stripped, revealing the desired circuit pattern.

Embedded passive technology (EPT) is a relatively new technology that has been used to fabricate passives, such as resistors and capacitors, into printed circuit boards during the board fabrication process. Compared with integrated passives, in which passive arrays and networks are arranged on carrier substrates, embedded passives are fabricated into the substrate during processing. EPT is driven by various factors, including the need for better electrical performance, higher packaging density of passives, and potential cost savings. Using EPT, passives may be placed directly below the active device, thus resulting in a shorter distance between the passive and active components and reducing the parasitic effect associated with surface mounted passives, resulting in better signal transmission and less cross talk.

One EPT process is described in U.S. Pat. No. 6,281,090 to Kukanskis et al., the subject matter of which is incorporated herein by reference in its entirety. This process involves the following sequence of processing steps: 1) applying an etch resist on the surface of a metal clad laminate (or multilayer package) in a desired pattern, wherein the pattern preferably defines the conductive circuits desired in a positive manner and defines the areas between the circuits and locations for the resistors in a negative manner; 2) etching away the exposed copper and preferably removing the etch resist; 3) activating the surfaces to accept plating thereon; 4) applying a plating mask which covers substantially all of the surfaces except for the areas where the resistors are to be plated; 5) plating the exposed areas with a resistive material; 6) stripping away the plating mask; and 7) coating the surface of the board with a protective coating.

A similar EPT process is described in U.S. Pat. No. 6,767,445 to Kukanskis et al., the subject matter of which is herein incorporated by reference in its entirety, but does not use a mask during the plating step. Instead, this process selectively activates the surface of the metal-clad laminate so as to prevent the entire surface of the substrate from being activated. The selective activation ste
is generally accomplished using a mask to prevent the entire substrate from being activated. The remaining steps in the process are the same or similar to the process steps described in U.S. Pat. No. 6,281,090.

A preferred resistive metal for use in the process of the invention is an electroless nickel-phosphorus solution. Resistance values that can be obtained using prior art electroless nickel-phosphorus compositions generally range only from 10 to 100 ohms/square. However, embedded resistors having resistance values between about 10 to 10,000 ohms/square±5% are highly desirable.

Furthermore, in order to embed the layer, it is manufactured as part of a sandwich of layers that are pressed together in a press cycle at a temperature of between about 140 and 200° C. and a pressure between about 150 and 200 psi. After the press cycle, a change in resistance values of up to 3 percent is generally observed.

It would be highly desirable to expand the resistance range of the nickel phosphorus resistor material while maintaining the stability of the resistance during the press cycle. To that end, the present inventors have determined that the codeposition of another material with the electroless nickel-phosphorus composition can expand the resistance range of the plated resistor. The codeposited material is generally selected from various particles that remain stable under the press conditions described above.

SUMMARY OF THE INVENTION

It is an object of the present invention to provide an embedded nickel-phosphorus resistor having an expanded range of resistance.

It is another object of the present invention to provide a nickel-phosphorus plated resistor that maintains its stability during the press cycle.

The present invention is directed to an improved electroless nickel-phosphorus plating composition that can be used to create embedded resistors in multi-layered printed circuit boards. The improved process of the invention codeposits particles along with the electroless nickel-phosphorus.

The invention is directed a method of manufacturing a printed circuit board with integral plated resistors, comprising the steps of:

a) forming a circuit pattern on a surface of a metal clad laminate, which laminate comprises a polymer-based core, and leaving openings in said circuit pattern onto which a resistive material can be plated;

b) coating said circuit with a resist and exposing said circuit so that the openings in the desired pattern and a portion of the metal cladding are exposed;

c) conditioning and selectively activating the exposed areas of the metal clad laminate to accept plating thereon;

d) stripping the resist; and e) plating the activated area with said resistive material to create an integral plated resistor, wherein the resistive material comprises an electroless nickel-phosphorus composition having particles selected from the grou consisting of polytetrafluoroethylene, silicon carbide, tungsten carbide, particles that fully sinter below 170° C., and combinations of the foregoing, uniformly dispersed therein.

DETAILED DESCRIPTION OF THE INVENTION

An example of a suitable processing sequence for the practice of the invention is set forth as follows (and described more fully in U.S. Pat. No. 6,767,445 to Kukanskis et al.):

(a) apply an etch resist onto the surfaces of a metal clad laminate such that the resist defines the desired circuitry in a positive manner and the areas between the circuits, including the locations for the resistors, are defined in a negative manner;

(b) etch away exposed copper surfaces and stri the resist;

(c) optionally, treat the exposed dielectric surfaces with a process selected from the grou consisting of chemical etching, plasma etching, laser normalization, vapor blasting, sanding, shot blasting, and sand blasting;

(d) activate the exposed dielectric surfaces through a mask to selectively activate only portions of the exposed dielectric surfaces;

(e) stri the resist;

(f) plate the activated surfaces with a resistive material;

(g) optionally, contact the plated areas with an oxidant;

(h) optionally, coat the resistors with a permanent protective coating.

Other processing sequences, including those described in U.S. Pat. No. 6,281,090 to Kukanskis et al., are also usable in the practice of the invention.

Steps (a) and (b) together call for the creation of defined circuitry on the surfaces of a metal clad dielectric laminate (or multi-layer package—several layers of circuitry containing one or more innerlayers of circuitry, which have been laminated into a single planar package. The key is the definition and creation of a circuit pattern on the surfaces of the metal clad laminate along with the definition and creation of specific breaks in the circuitry where the resistors will be plated (the "resistor areas"). The length and width of the specific resistor areas directly impact the resistance achieved after plating.

The definition and creation of circuitry and the resistor areas can be accomplished in many ways. The most prevalent way is through the subtractive process as described in current steps (a) and (b). In the subtractive process, a metal (usually copper) clad laminate is used. The metal clad laminate comprises a planar dielectric substrate with metal foil adhered to both exterior surfaces. A resist pattern is applied to the metal surfaces such that the resist defines the circuits in a positive manner and the areas between the circuits and the resistor areas in a negative manner, most often by using a photoresist, which is applied to the metal surfaces in either liquid or dry form. The photoresist is then selectively exposed to actinic radiation through a photomask. Depending on the photomask technology used, the unexposed or exposed areas of the resist are developed away revealing the desired pattern. As an alternative, the resist may be screened onto the metal surfaces directly in the desired pattern. After the circuits are defined with the resist, the exposed copper areas are etched away and the resist is stripped revealing the circuits. Thus the areas between the circuits and the resistor areas are now bare dielectric.

Step (c) is optional, but recommended. In order for the resistors to be usable and reliable the resistance must be predictable, relatively constant and reliable, which may be accomplished by uniformizing the dielectric surface upon which the resistor is to be plated. Uniformizing can be achieved in several ways such as vapor blasting, chemical etching, plasma etching, laser normalization or mechanical uniformization. Mechanical uniformization can be achieved by sanding, sand blasting or shot blasting. Surface uniformization through chemical etching has been demonstrated to be the most reliable and efficient means. The particular etchant used in this regard must be matched with the dielectric being used.

Step (d) involved selectively activating the surfaces to be plated. A mask is used so that the surface is selectively activated only on the surfaces not covered by the mask. Activation of the surfaces can range in complexity from a single di in a precious metal activator (or non-precious metal or other activators know in the art) to a full plating cycle involving numerous steps. Regardless of the activation cycle chosen, its primary purpose is to treat the surfaces such that they initiate and accept plating. A wide variety of methods for achieving conditioning and activation are known in the art, any of which may be advantageously utilized here.

Step (e) involves a simple stripping of the resist. Depending upon the resist used, the stripping can occur in aqueous alkaline solutions or in solutions of organic solvents. The use of aqueous strippable resists is preferred. In addition, one should be sure that the resist stripping operation does not negatively affect the conditioning and activation of the surfaces or the subsequent plating.

Step (f) involves plating the resistors, and optionally but preferably, the exposed copper surfaces. At this stage the plating will occur only on the areas selectively activated in step (d) (i.e. the resistor areas, preferably with some overlap onto the circuits where the resistor connects to the circuits and exposed copper surfaces). A variety of plating baths can advantageously be used, including electroless nickel-phosphorous, electroless and precious metal plating baths, including palladium-phosphorus, or ruthenium-phosphorus electroless plating baths. In a preferred embodiment, the plating bath is an electroless nickel-phosphorus plating bath.

Step (g) optionally provides for controlled oxidation of the plated resistor metal preferably by controlled chemical oxidation. The inventors have discovered that controlled oxidation increases the resistivity of the plated resistor and more importantly provides for more predictable resistance on a consistent basis. In this regard, a variety of oxidants may be used including potassium iodate, which is preferred. Here again, the higher intrinsic resistance material allows for greater thickness of plated material (other variables constant), more reliable plated resistors and commercially acceptable plating times.

Finally, step (h) provides for coating the resistors with a permanent protective coating. It is usually desirable to coat the surfaces of the board, including the plated resistors, with a dielectric material such as a solder mask or an epoxy or other resin system. Other systems would also be readily apparent to those skilled in the art. This protective coating serves to protect the board from damage in subsequent processing steps and enhances the durability of the resulting product.

Depending upon the ultimate resistance desired, the following factors may be adjusted to vary the resistivity of the resultant resistor: type of metal plated, thickness of the metal plated, length of the resistor and, width of the resistor. With regard to type of metal plated, the phosphorous content of the metal-phosphorous will affect the resistivity of the final deposit. All of the foregoing factors may be varied to achieve the ultimate resistance desired.

The inventors of the present invention have found, that it is most advantageous to plate the resistors with nickel having a phosphorous content of greater than 9% by weight because the intrinsic resistance of the metal plated increases with the phosphorous content of the metal. The inventors of the present invention have found that it is possible to expand the resistance range of the electroless nickel-phosphorus plated resistor with the codeposition of another material. The inventors have discovered that if certain types of particles are uniformly dispersed in the electroless nickel-phosphorus plating composition, the particles can be codeposited with the electroless nickel-phosphorus composition to provide a resistor with improved properties.

The codeposited material is chosen based on its stability during press conditions utilized to manufacture the multi-layered printed circuit board. The improved integral plated resistors of the invention also exhibit a larger resistance range than has previously been achievable in the prior art.

Particles that may be used in the modified electroless-nickel composition of the invention include Teflon® (polytetrafluoroethylene), silicon carbide, tungsten carbide, and other similar particles that fully fuse (sinter) at temperatures of less than 170° C. Examples of particles that fully sinter at temperatures below about 170° C. include, but are not limited to boron carbide, boron nitride, iron oxide, in addition to the above mentioned particles. The codeposited particles increase the range of resistance of the embedded resistor and are also stable during the press cycle.

In a preferred embodiment, the electroless nickel-phosphorus plating composition of the invention comprises 0.1 to 1.0 percent by weight nickel and about 10 to 18 percent by weight phosphorus. The particles are dispersed in the electroless nickel-phosphorus composition at a concentration between about 10 to 20 percent by weight of the particles, depending on the type of particles used.

The ingredients are mixed using continuous mixing to uniformly disperse the particles in the electroless nickel-phosphorus plating composition.

The thickness of the metal plated has a direct impact on the resistivity of the resultant resistor. The inventors have found that typically it is advantageous to plate metal thickness in the range of from 0.05 to 0.2 microns, preferably 0.10 microns. Plating advantageously takes 5 to 10 minutes, more preferably 2 to 3 minutes depending upon the plating bath used and the ultimate resistance desired. The electroless nickel-phosphorus composition of the invention is plated onto a prepared printed circuit board to form the resistor. Preferably, the resistor is plated to a thickness of 0.05 to 0.2 microns, more preferably the resistor is plated to a thickness of 0.20 microns.

Once the resistor(s) are plated onto the prepared printed circuit boards and processed as described above, the multi-layered printed circuit board is subjected to a press cycle (pressure and heat) to integrate the passive element into the multi-layer printed circuit board.

The improved resistor of the invention has a resistance change after the press cycle of less than 5%, preferably a resistance change of less than 3%. The improved resistor also has a resistance range of 10–1000 ohms/sq.

Furthermore, while the electroless nickel solution is preferably a nickel-phosphorus composition, the invention is not limited to electroless nickel-phosphorus compositions. Other suitable compositions would also be known to those skilled in the art.

What is claimed is:

1. A method of manufacturing a printed circuit board with integral plated resistors, comprising the steps of:
   a) forming a circuit pattern on a surface of a metal clad laminate, which laminate comprises a polymer-based core, and leaving openings in said circuit pattern onto which a resistive material can be plated;
   b) coating said circuit with a resist and exposing said circuit so that the openings in the desired pattern and a portion of the metal cladding are exposed;
   c) conditioning and selectively activating the exposed areas of the laminate to accept plating thereon;
   d) stripping the resist; and
   e) plating the activated area with said resistive material to create an integral plated resistor,
   wherein the resistive material comprises an electroless nickel-phosphorus plated composition and about 10 to about 20% by weight of particles, said particles being selected from the group consisting of polytetrafluoroethylene, silicon carbide, tungsten carbide, particles that fully sinter below 170° C., and combinations of the foregoing uniformly dispersed therein, and wherein the electroless nickel-phosphorous plated composition comprises at least 9% by weight phosphorous.

2. The method according to claim 1, wherein the plated resistors have a resistance range between about 1–1000 ohms/sq.

3. The method according to claim 1, wherein steps (a) through (e) are repeated to produce multiple integral plated resistors on the surface of the metal clad laminate.

4. The method according to claim 1, further comprising a step of coating said integral plated resistor with a permanent dielectric coating to protect the plated resistor from additional processing steps.

5. The method according to claim 1, wherein said step (c) is accomplished using a mask so as to activate only selected portions of the exposed areas of the metal clad laminate.

6. The method according to claim 1, wherein the resist comprises a negative or positive acting dry film or liquid photo-resist.

7. The method according to claim 1, wherein the resistive material is plated to a thickness from about 0.05 to about 0.5 microns.

8. The method according to claim 7, wherein the resistive material is plated to a thickness of about 0.2 microns.

9. The method according to claim 1, wherein the particles that fully sinter below 170° C. are selected from the group consisting of boron carbide, boron nitrate, iron oxide, and combinations of the foregoing.

* * * * *